(12) United States Patent
Abe et al.

(10) Patent No.: US 8,119,924 B2
(45) Date of Patent: Feb. 21, 2012

(54) WIRING BOARD, PACKAGING BOARD AND ELECTRONIC DEVICE

(75) Inventors: Katsumi Abe, Tokyo (JP); Kenichiro Fujii, Tokyo (JP); Atsumasa Sawada, Tokyo (JP)

(73) Assignee: NEC Corporation, Tokyo (JP)

( * ) Notice: Subject to any disclaimer, the term of this patent is extended or adjusted under 35 U.S.C. 154(b) by 706 days.

(21) Appl. No.: 12/295,286

(22) PCT Filed: Mar. 30, 2007

(86) PCT No.: PCT/JP2007/057072
§ 371 (c)(1),
(2), (4) Date: Sep. 29, 2008

(87) PCT Pub. No.: WO2007/119608
PCT Pub. Date: Oct. 25, 2007

(65) Prior Publication Data
US 2009/0107703 A1 Apr. 30, 2009

(30) Foreign Application Priority Data
Mar. 31, 2006 (JP) .................................. 2006-099163

(51) Int. Cl.
*H05K 1/00* (2006.01)

(52) U.S. Cl. ........ 174/258; 174/250; 174/254; 174/256; 174/257; 174/260; 257/40; 257/668; 428/31; 428/192

(58) Field of Classification Search ............... 174/258, 174/250, 254, 256, 257, 260, 512; 257/40, 257/668; 428/31, 192
See application file for complete search history.

(56) References Cited

U.S. PATENT DOCUMENTS

| | | | | |
|---|---|---|---|---|
| 4,338,149 A | * | 7/1982 | Quaschner | 156/248 |
| 4,431,711 A | * | 2/1984 | Eisfeller | 428/31 |
| 4,687,695 A | * | 8/1987 | Hamby | 428/192 |
| 4,715,928 A | * | 12/1987 | Hamby | 216/18 |
| 5,615,088 A | | 3/1997 | Mizumo | |
| 5,652,645 A | * | 7/1997 | Jain | 355/53 |
| 6,294,831 B1 | | 9/2001 | Shishido et al. | |
| 2004/0154911 A1 | * | 8/2004 | Burgess et al. | 200/512 |
| 2004/0168824 A1 | * | 9/2004 | Sekido | 174/256 |
| 2006/0273304 A1 | * | 12/2006 | Cok | 257/40 |
| 2007/0023877 A1 | * | 2/2007 | Yamazaki | 257/668 |
| 2007/0095563 A1 | * | 5/2007 | Sekido | 174/256 |
| 2008/0289859 A1 | * | 11/2008 | Mikado et al. | 174/254 |
| 2009/0032295 A1 | * | 2/2009 | Okajima et al. | 174/260 |

FOREIGN PATENT DOCUMENTS

| | | |
|---|---|---|
| JP | 06-168985 A | 6/1994 |
| JP | 06-334279 A | 12/1994 |
| JP | 10-178271 A | 6/1998 |

(Continued)

*Primary Examiner* — Xiaoliang Chen
(74) *Attorney, Agent, or Firm* — Sughrue Mion, PLLC

(57) ABSTRACT

Stress concentration at the connecting portion of the electronic component and the curved board and the area around the connecting portion is suppressed. In a flexible wiring board, insulation layers (11, 13) and wiring layers (12, 15) are piled up alternately and wiring layers (12, 15) are via-connected each other. The board comprises reinforced area (10a) reinforced against external stress, bending area (10c) bending easier than the reinforced area (10a) by external stress, and a stress relaxation area (10b) provided in area between the reinforced area (10a) and the bending area (10c), bending easier than the reinforced area (10a) but not easier than the bending area (10c) by the external stress, and relaxing the stress carried from the bending area (10c) to the reinforced area (10a).

10 Claims, 16 Drawing Sheets

(EXEMPLARY EMBODIMENT 5)

FOREIGN PATENT DOCUMENTS

| | | |
|---|---|---|
| JP | 2002-151853 A | 5/2002 |
| JP | 2002-330319 A | 11/2002 |
| JP | 3395164 B2 | 2/2003 |
| JP | 2004-266074 A | 9/2004 |
| JP | 2005-236205 A | 9/2005 |
| JP | 2005-303172 A | 10/2005 |

* cited by examiner

FIG. 1A  (EXEMPLARY EMBODIMENT 1)
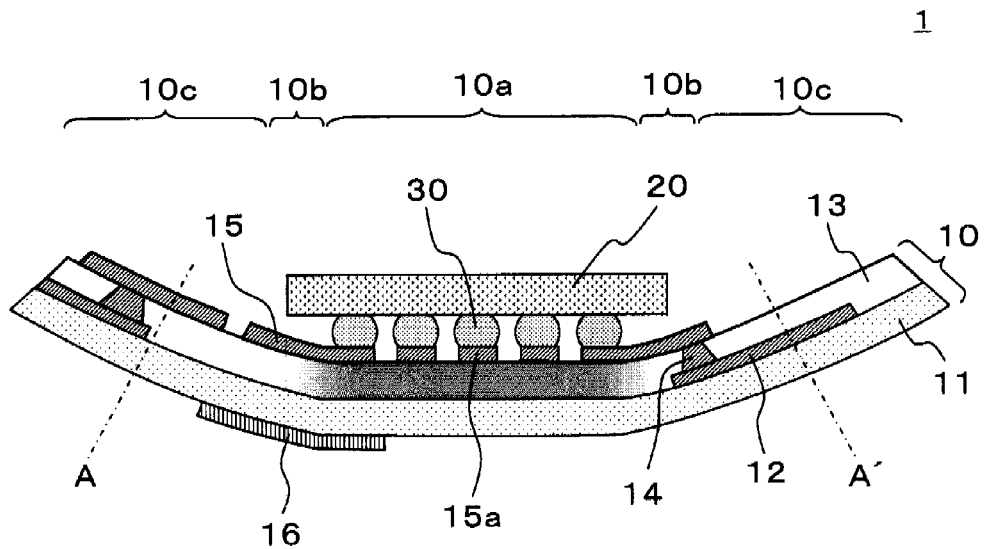
FIG. 1B  (EXEMPLARY EMBODIMENT 1)
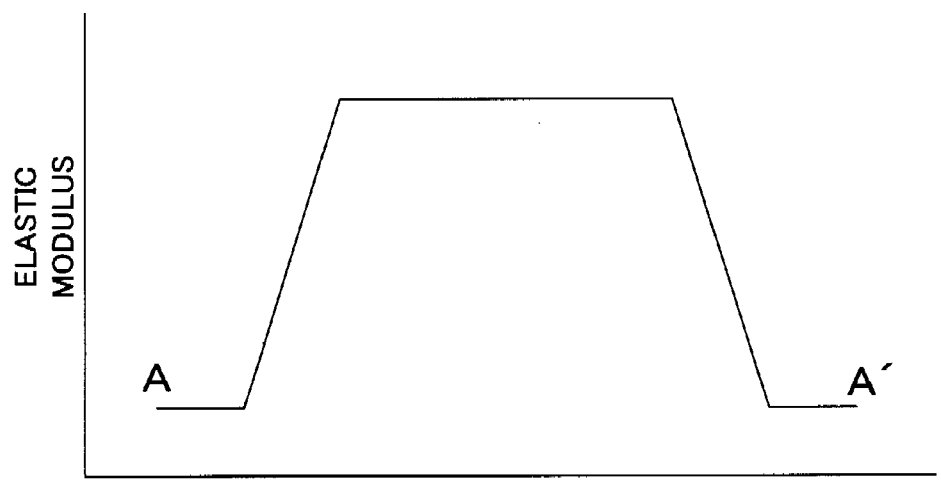

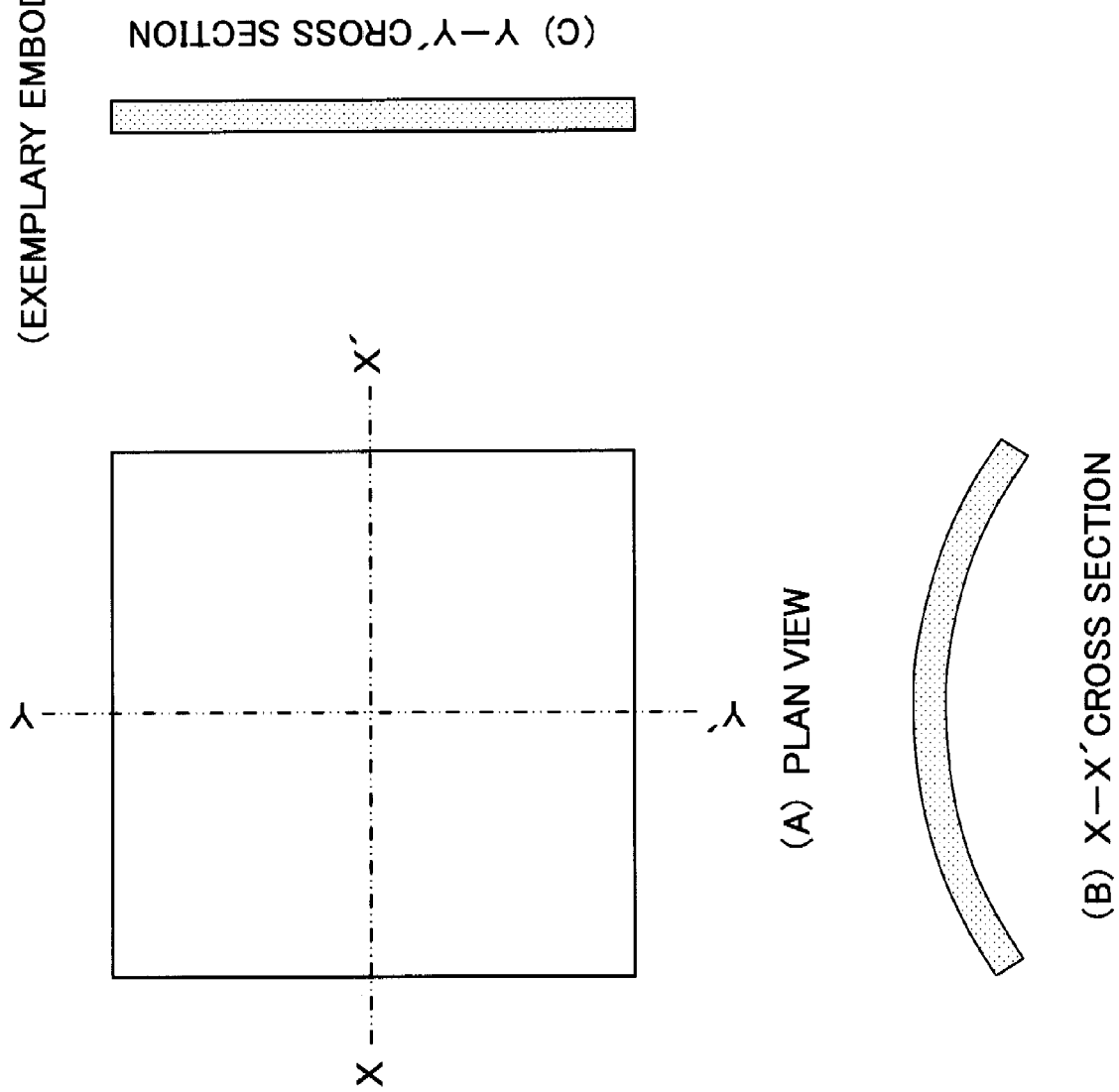

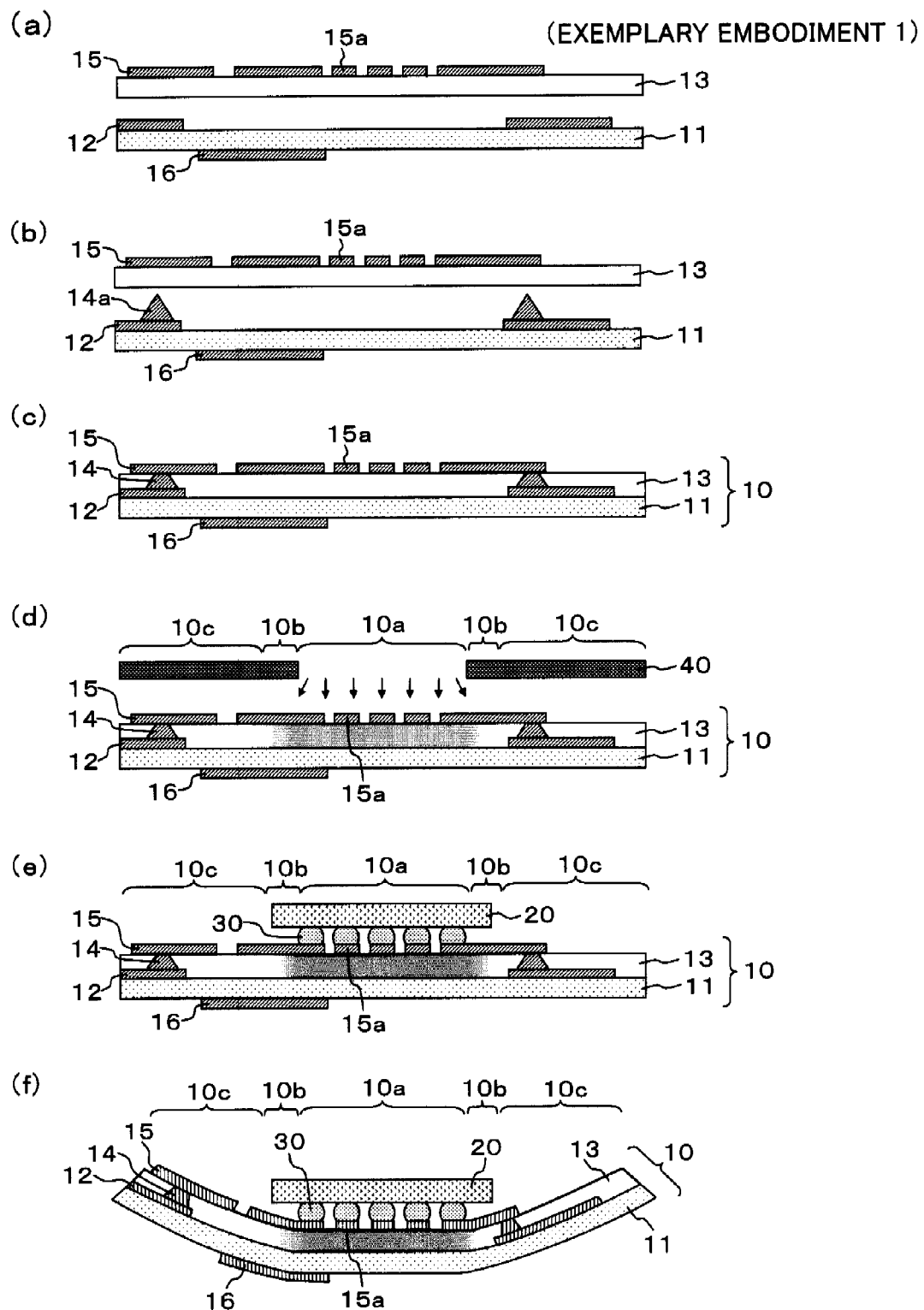

FIG. 5A (EXEMPLARY EMBODIMENT 2)
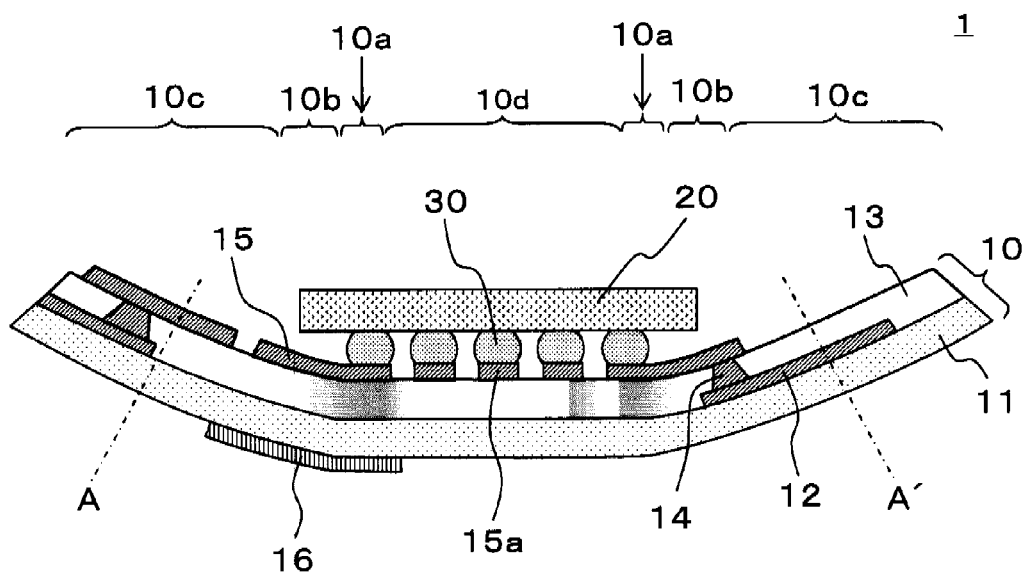
FIG. 5B (EXEMPLARY EMBODIMENT 2)
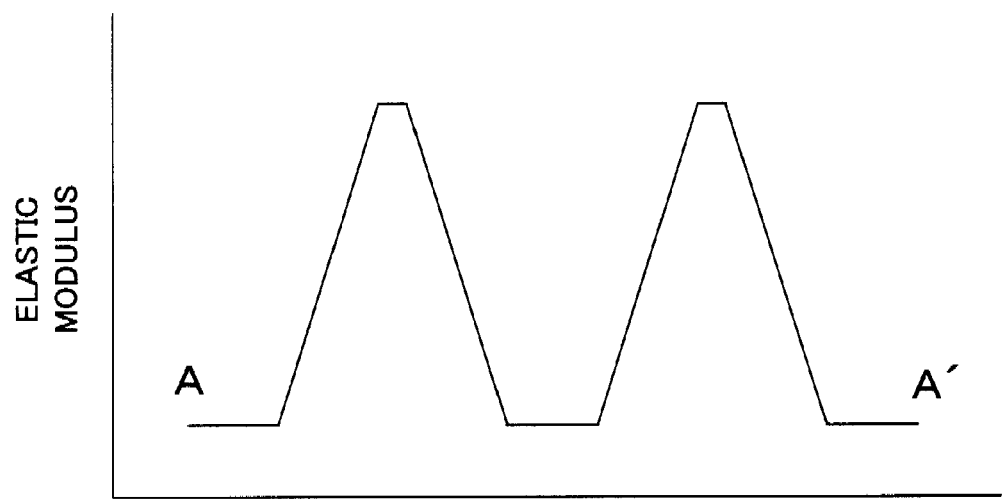

FIG. 7A (EXEMPLARY EMBODIMENT 3)
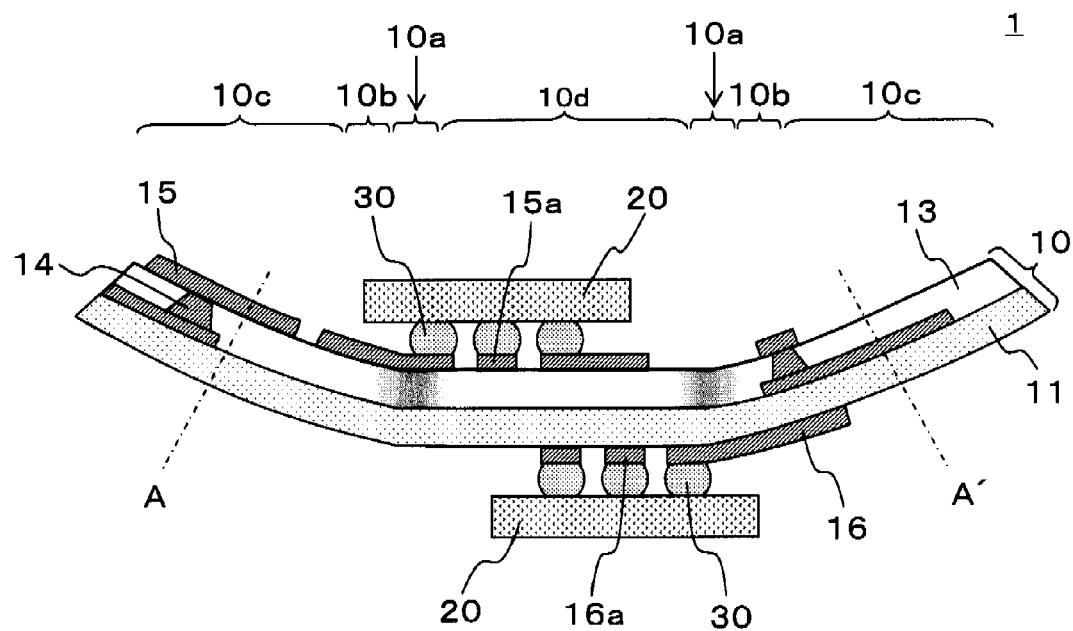
FIG. 7B (EXEMPLARY EMBODIMENT 3)
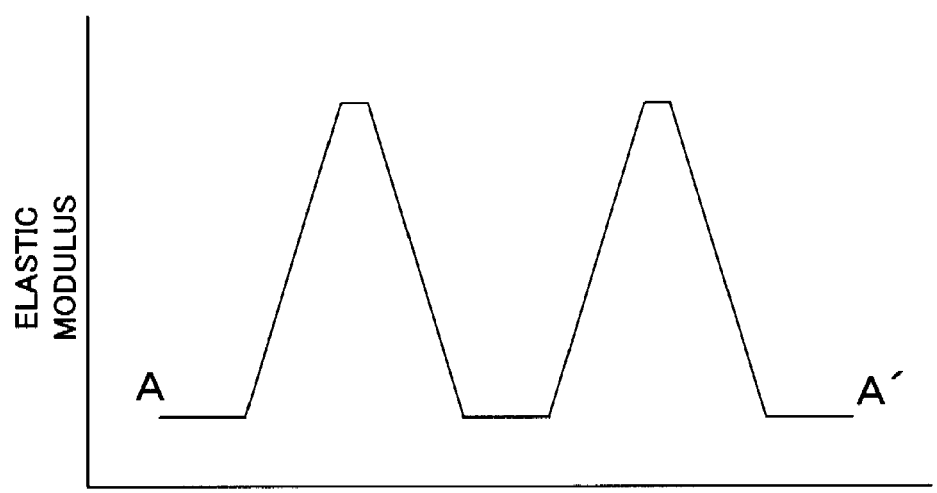

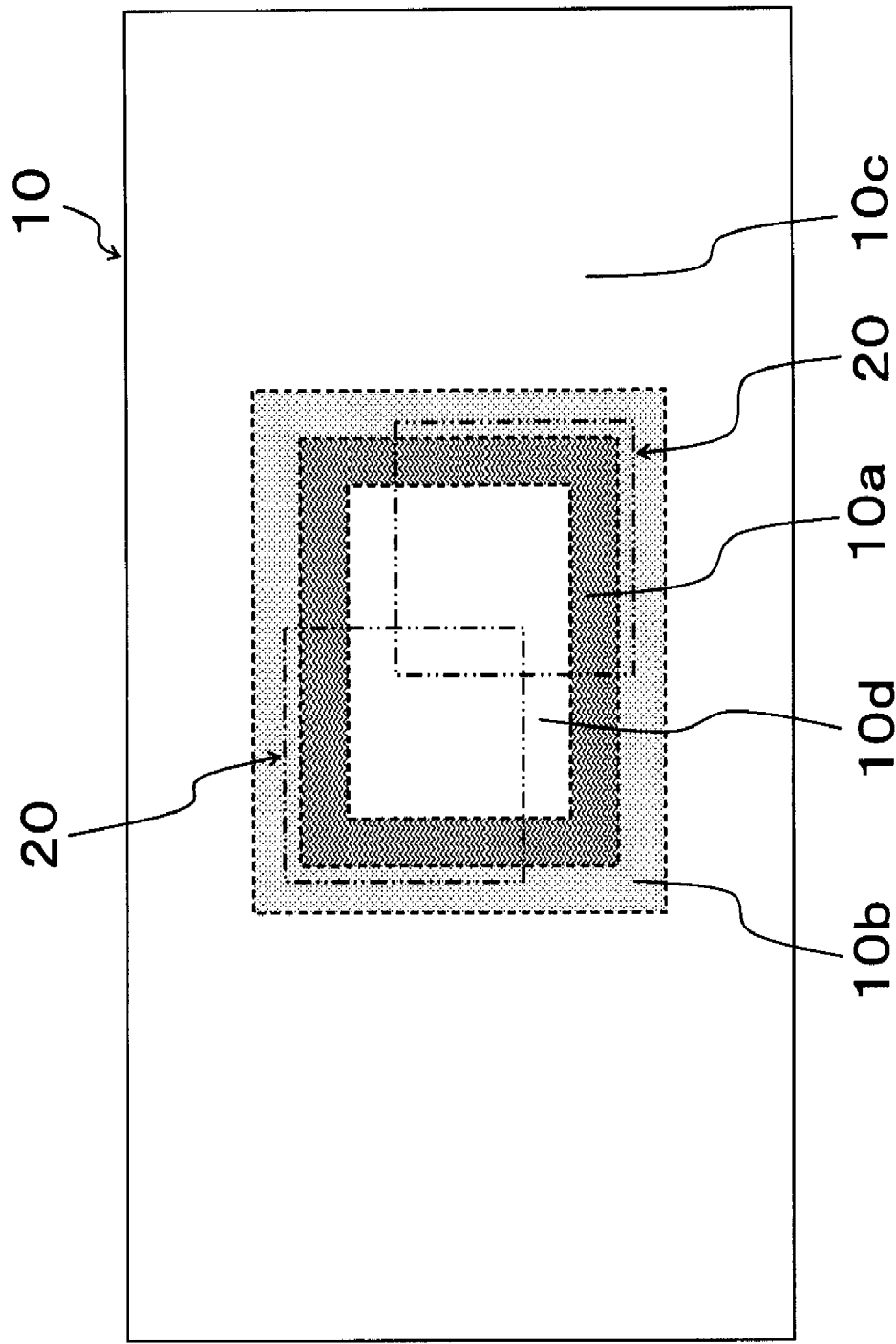

FIG. 9A (EXEMPLARY EMBODIMENT 4)
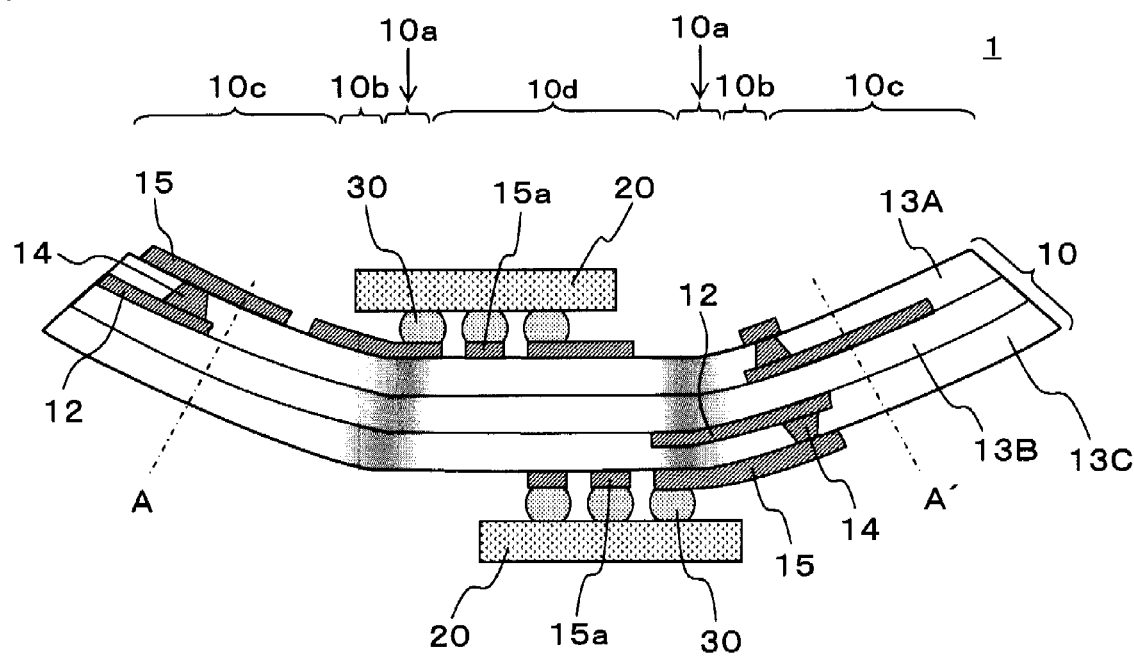
FIG. 9B (EXEMPLARY EMBODIMENT 4)
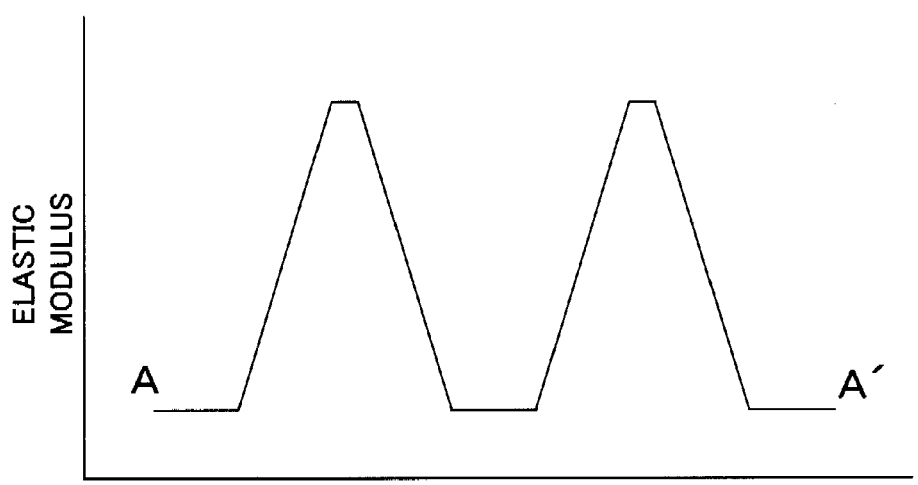

FIG. 10 (EXEMPLARY EMBODIMENT 4)
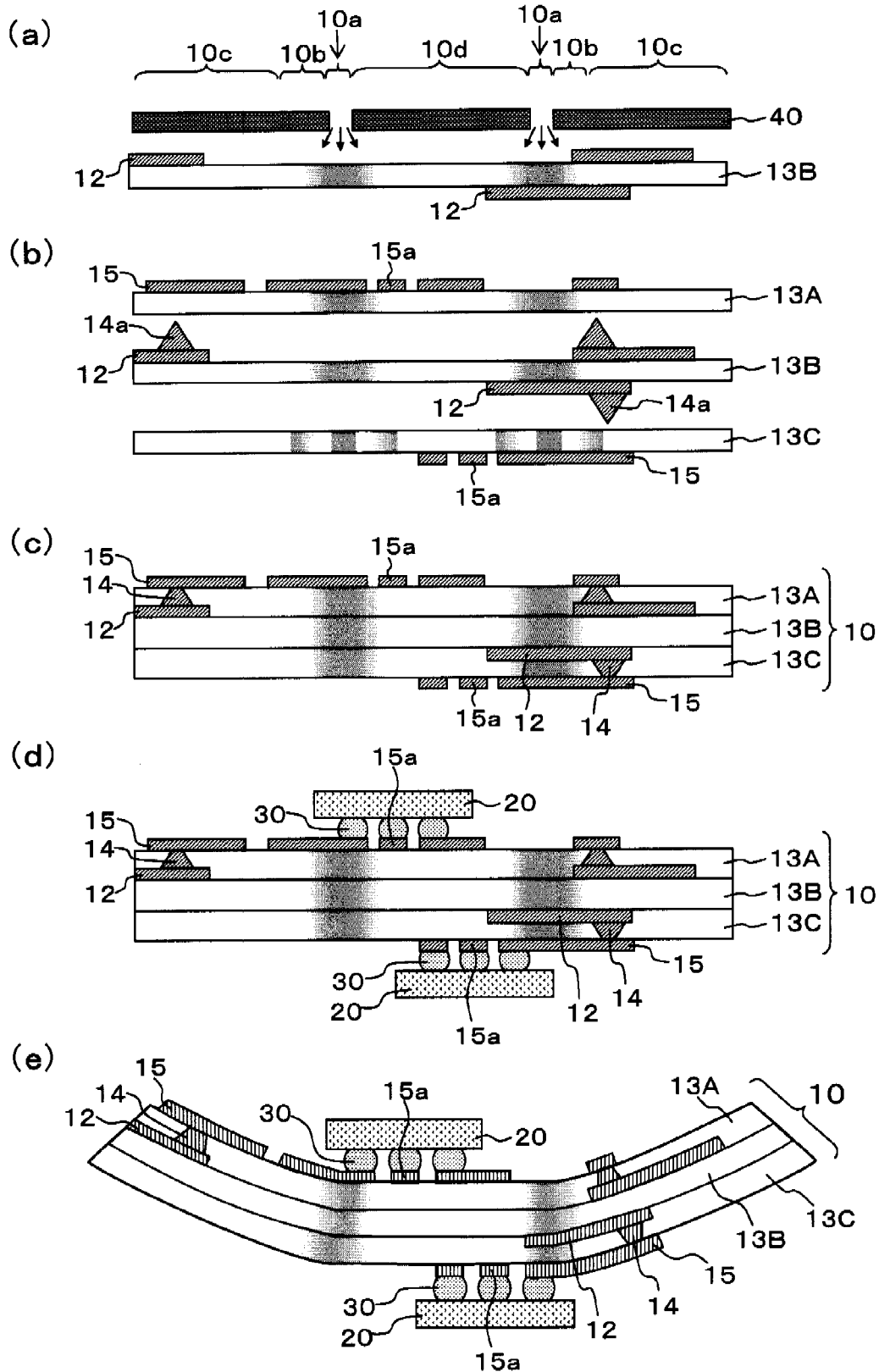

FIG. 11A (EXEMPLARY EMBODIMENT 5)
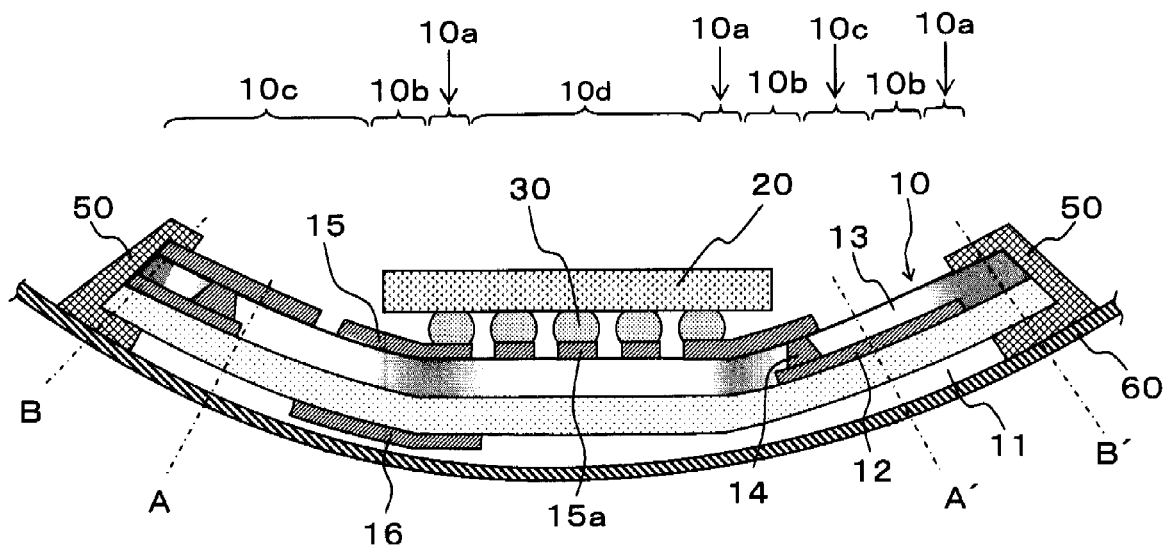
FIG. 11B (EXEMPLARY EMBODIMENT 5)
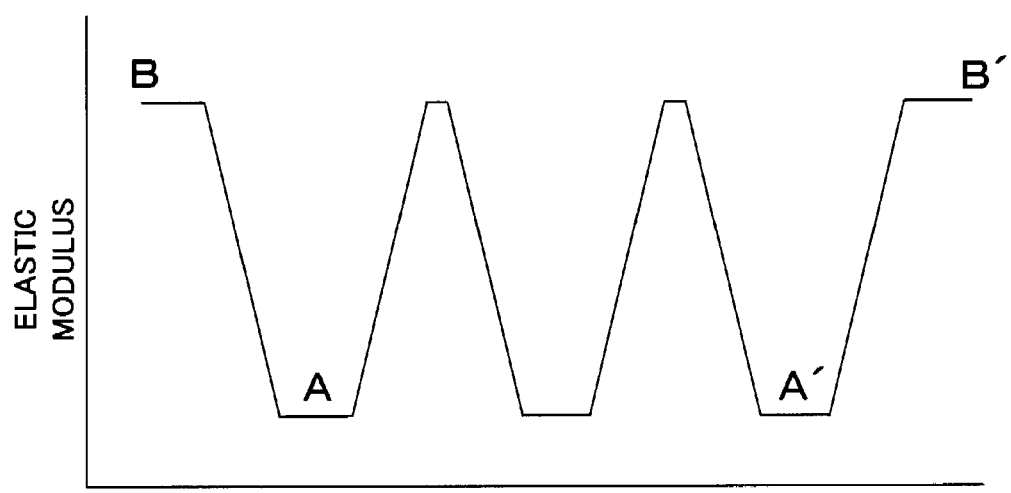

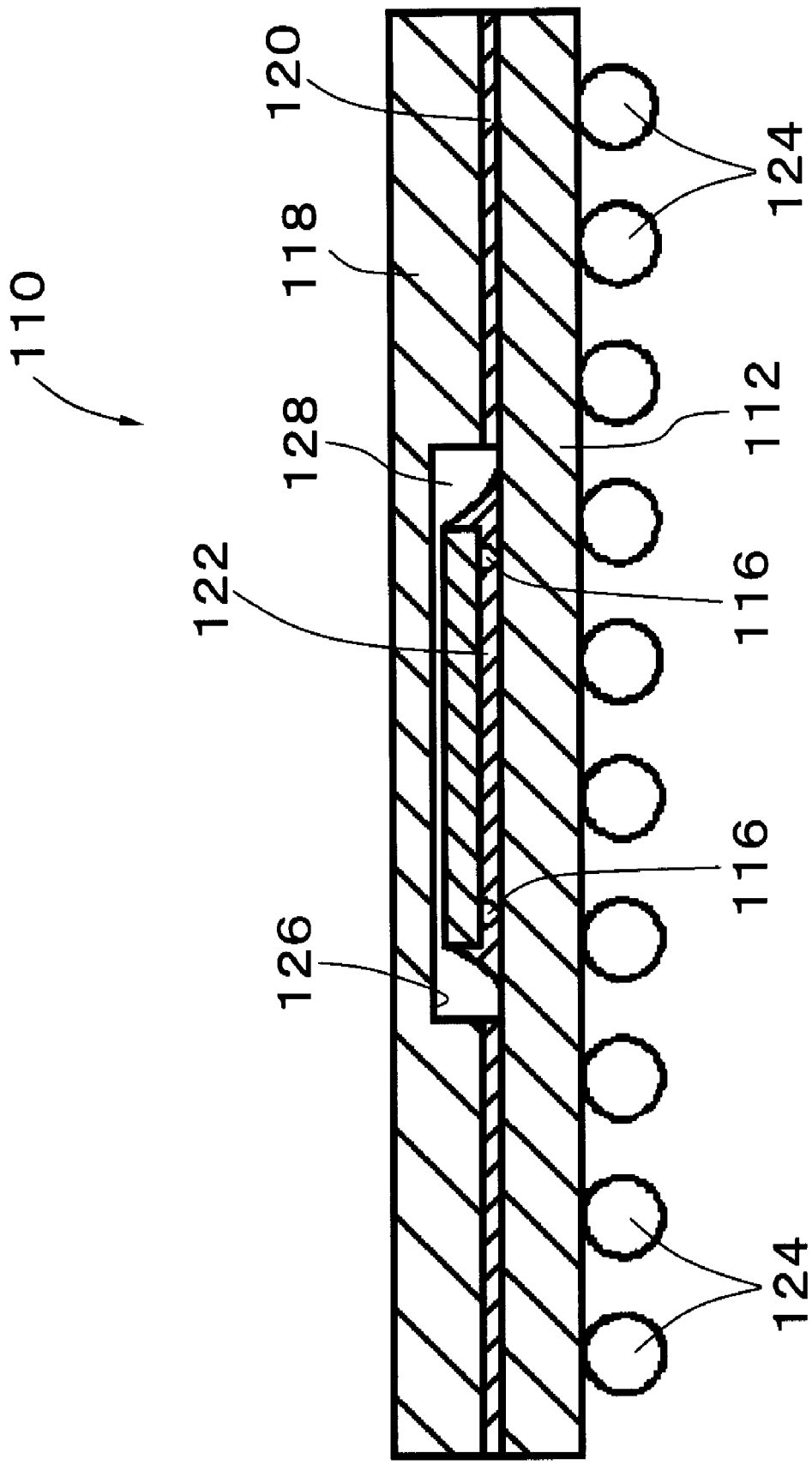
FIG. 12 [CONVENTIONAL ART 1]

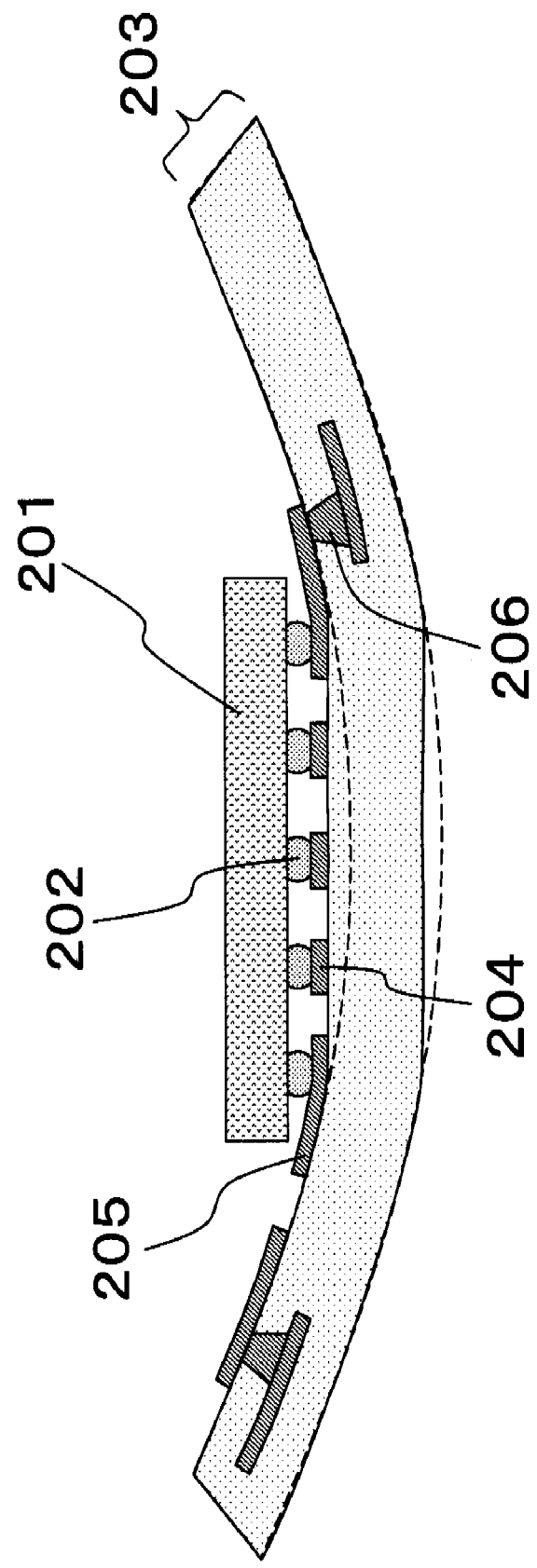
FIG. 13 [CONVENTIONAL ART 2] (COMPARATIVE)

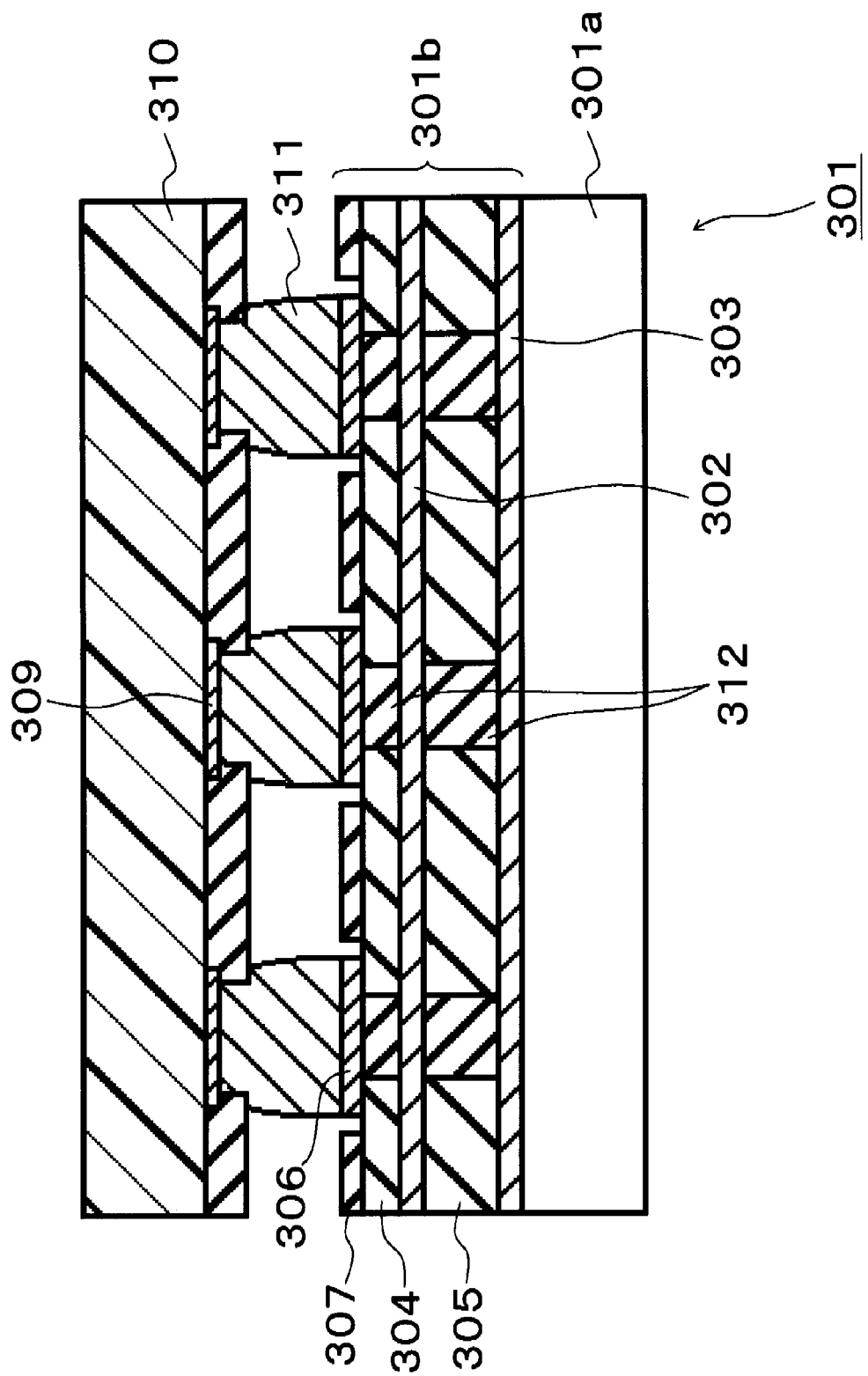
FIG. 14 [PRIOR ART 3]

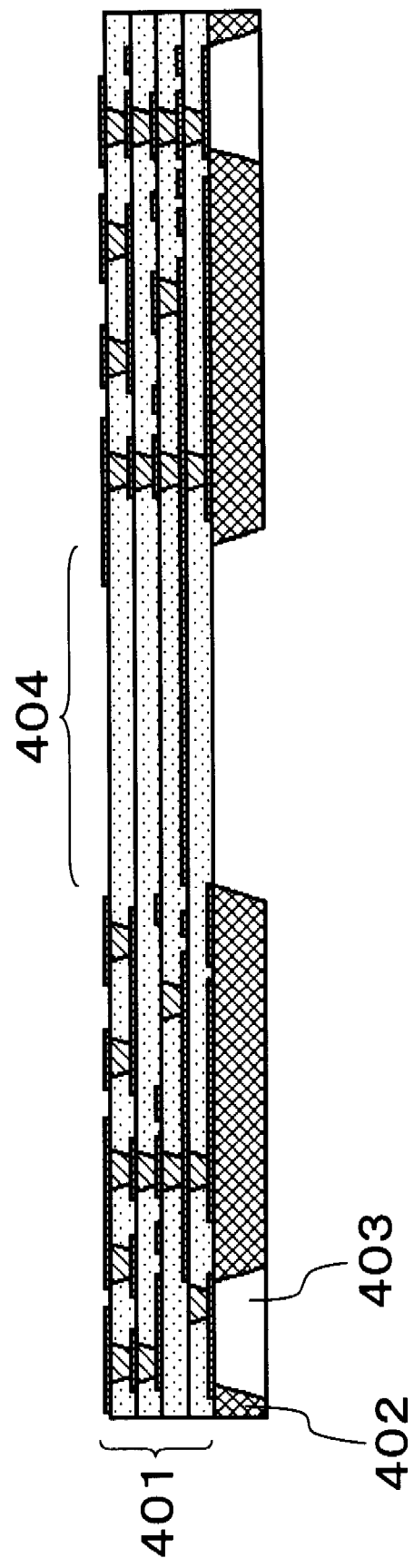
FIG. 15 [CONVENTIONAL ART 4]

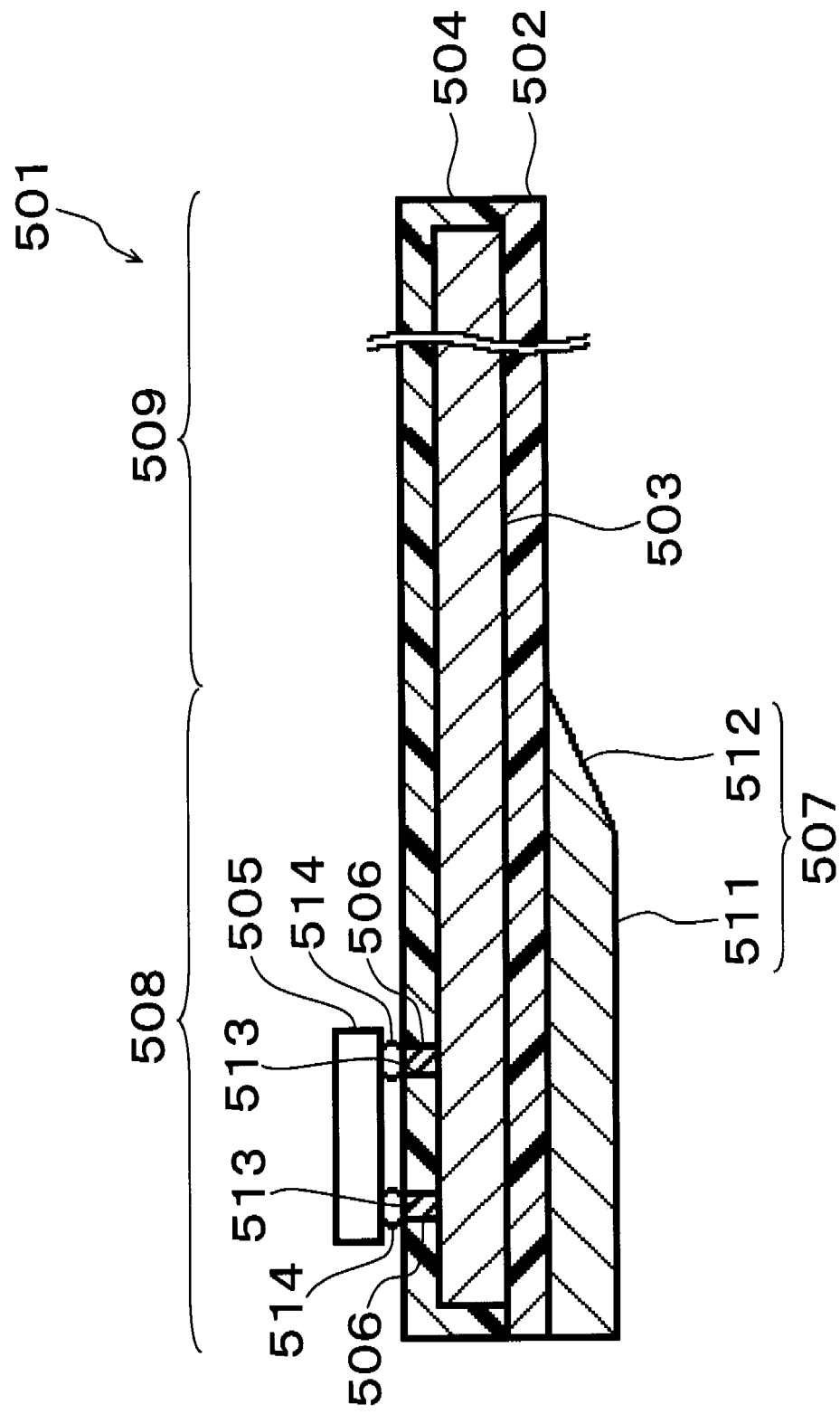
FIG. 16 [CONVENTIONAL ART 5]

WIRING BOARD, PACKAGING BOARD AND ELECTRONIC DEVICE

FIELD OF THE INVENTION

The present invention relates to a wiring board (circuit board), a packaging (or mounted) board and an electronic device, and particularly relates to a wiring board (circuit board), a packaging board and an electronic device partially having a high elastic modulus area.

BACKGROUND ART

Nowadays the portable apparatus market such as a mobile phone is increasing and a design of the apparatus as well as advanced functions or capabilities is becoming more important for the market. Furthermore, a curved surface of a casing is becoming popular for the purpose of better handling or looks. However, current electronic components mounted on a board in a mobile phone are usually arranged on a planar wiring board and therefore, it is difficult to arrange the components with efficiency in the casing formed by the curved surface. In addition, because the freely-designed shape may cause problems such as an increasing of a bulk of the apparatus, the apparatus often has to compromise its design. As a result, a commercialization of a wiring board having a curved surface corresponding to the outer curved surface of an apparatus, in which electronic components can be efficiently arranged, is strongly desired.

By the way, packaging boards (e.g. semiconductor devices), in which electronic components such as semiconductor packages or semiconductor chips are mounted on wiring boards, are packaged in the portable apparatus whose size is required to be reduced. At a bottom of the packaging board, pads (ball bump 124, connecting terminal) called BGA (Ball Grid Array) as described in Patent Document 1, CSP (Chip Size Package) or WL-CSP (Wafer Level Chip Size Package), for example, are arranged in a grid pattern (see FIG. 12). This type of packaging board is used popularly because more terminals can be implemented in a narrow area.

A method to print a cream solder on a pad of a wiring board using a metal mask, mount an electronic component on the wiring board and fuse the solder by a reflow process is used for connecting the electronic component on the wiring board mechanically and electrically.

[Patent Document 1] JP-3395164B (FIG. 1)
[Patent Document 2] JP Patent Kokai Publication No. JP-P2004-266074A (FIG. 1)
[Patent Document 3] JP Patent Kokai Publication No. JP-P2002-151853A (FIG. 7)
[Patent Document 4] JP Patent Kokai Publication No. JP-P2005-303172A (FIG. 5)

SUMMARY OF THE DISCLOSURE

Problems to be Solved by the Invention

The entire disclosures of Patent Documents 1 to 4 are incorporated herein by reference thereto.

However, when curving the planar board mounting the electronic components, a problem of disconnection of the solder connection occurs according to the size of the component or a curvature of the curved surface. The same problem of disconnection of the solder connection according to the size of the component or a curvature of the curved surface will occur when an electronic component used for mounting on a planar board is mounted on a curved wiring board.

As shown in FIG. 13, for example, a stress (internal stress) is produced at a soldered connecting portion (a connecting portion of a solder ball 202 and a pad 204) by both an electronic component 201 which tends to keep a planar shape and a wiring board 203 which forms curved shape when the electronic component 201 is mounted on the concave-curved wiring board 203. An additional outer stress loaded on the soldered connecting portion under the internal stress state of the soldered connecting portion may cause the disconnection (defective connection) of the solder.

As described above, it is difficult to keep good connection reliability of the components and the curved wiring board because of the stress generated at the connecting portion of the conventional components and the curved board.

The same problem of the stresses generated at the solder balls of the electronic components mounted on the wiring board by deformation of the wiring board has been observed even when a flexible board is used instead of the curved board.

Following solutions are disclosed against these problems. According to Patent Document 2, a structure of a board to protect a connecting portion (a connecting portion of a surface conductor layer 306 and a conductive connection material 311) by forming a rigid insulating deformation protecting portion (via) 312 beneath a terminal post (pad) 309 of an electronic component 310 or around the mounted position of the electronic component and increasing a rigidity of a wiring board 301 partially and restraining an influence of deformation of the wiring board at an outer area of the mounted position of the component is described as shown in FIG. 14. According to Patent Document 3, as shown in FIG. 15, a reinforcement layer 402 having a high elasticity is formed on a surface of a multilayer wiring board 401 and the layer is selectively etched.

However, the technique described in Patent Document 2 (FIG. 14) needs much cost due to a number of the insulating deformation protecting portions (vias) 312 as well as a restriction condition of a degree of wiring freedom of the internal conductive layers 302 and 303 of the wiring board 301. Similarly the technique described in Patent Document 3 (FIG. 15) involves increased board production cost due to increased production steps. In addition, although the protection of the soldered connecting portion of the electronic components can be possible by forming a high elasticity area, the stress is concentrated at a boundary between the high elasticity area and the low elasticity area and therefore, a wiring formed across the two areas may be disconnected at the boundary.

To prevent such a disconnection of the wiring board, Patent Document 4 discloses a mounting structure to relax the stress by a gradual decreasing of a thickness of a reinforcing plate 507 at a boundary area of a reinforcing portion 508 and a bending portion 509 as shown in FIG. 16. However, there is a problem that the thickness of a flexible wiring board 501 becomes thicker by the thickness of the reinforcing plate 507 when using a technique shown in Patent Document 4. In addition, there is a problem that no component can be mounted on the surface area of the flexible wiring board 501 facing the reinforcing plate 507 and where the reinforcing plate 507 is attached.

It is a main object of the present invention to restrain the stress concentration at the connecting portion of the electronic component and the curved board and the area around the connecting portion even when the electronic component is mounted on the curved board.

Means to Solve the Problems

According to a first aspect of the present invention, there is provided a flexible wiring board in which a plurality of insulating layers and wiring layers are piled up alternately and the wiring layers are via-connected each other. The wiring board comprises a reinforced area which is reinforced against an external stress; a bending area which bends easier than the reinforced area by the external stress; and a stress relaxation area which is provided in an area between the reinforced area and the bending area, and bends easier than the reinforced area by the external stress and not easier than the bending area by the external stress, and relaxes the stress carried from the bending area to the reinforced area. (structure 1)

The wiring board of the present invention is preferably structured such that an elastic modulus of the stress relaxation area is smaller than an elastic modulus of the reinforced area and is larger than an elastic modulus of the bending area, and the elastic modulus of the stress relaxation area changes continuously from a high value correspondent with a side near to the reinforced area to a low value correspondent with a side near to the bending area. (structure 2)

The wiring board of the present invention is preferably structured such that a degree of crystallization of at least one insulation layer of the stress relaxation area is smaller than a degree of crystallization of at least one insulation layer of the reinforced area and is larger than a degree of crystallization of at least one insulation layer of the bending area, and the degree of crystallization of the stress relaxation area changes continuously from a high value correspondent with a side near to the reinforced area to a low value correspondent with a side near to the bending area. (structure 3)

The wiring board of the present invention is preferably structured such that a degree of polymerization of at least one insulation layer of the stress relaxation area is smaller than a degree of polymerization of at least one insulation layer of the reinforced area and is larger than a degree of polymerization of at least one insulation layer of the bending area, and the degree of polymerization of the stress relaxation area changes continuously from a high value correspondent with a side near to the reinforced area to a low value correspondent with a side near to the bending area. (structure 4)

The wiring board of the present invention is preferably structured such that a quasi-reinforced area is provided radially internal of the reinforced area and surrounded with the reinforced area, and bends easier than the reinforced area, and the bending area and the stress relaxation area are provided at an outer circumference of the reinforced area.

The wiring board of the present invention is preferably structured such that at least one of the insulation layers is made of a photosensitive insulation material. (structure 6)

The wiring board of the present invention is preferably structured such that a plurality of pad portions are arranged inside an outer circumferential boundary line of the reinforced area on one side or both sides of the wiring board. (structure 7)

According to a second aspect of the present invention, there is provided a packaging board which comprises the wiring board and an electronic component electrically and mechanically connected to the pad portions via a conductive material. (structure 8)

The packaging board of the present invention is preferably structured such that a curvature of the reinforced area is smaller than a curvature of the bending area when a part or all of the wiring board is bended. (structure 9)

According to a third aspect of the present invention, there is provided an electronic device which comprises a casing having a curved exterior, the packaging board and a support member which is provided in the casing and supports the packaging board. (structure 10)

The electronic device of the present invention is preferably structured such that the packaging board is provided with the reinforced area at a part or all of a portion supported by the support member and the stress relaxation area is provided in an area adjacent to the reinforced area. (structure 11)

Meritorious Effects of the Invention

The meritorious effects of the present invention are summarized as follows. According to the present invention (claims 1-11), concentrated stresses on the soldered connecting portion and the wiring board can be restricted. A failure of a soldered connection occurring at a mounting process of general semiconductor package on a curved board can be restrained and a disconnection of the wiring board can be also restrained. Because there is no need for additional parts such as a reinforcing plate on the wiring board, a thickness of the packaging board can be maintained and a mounting area of the electronic components is not limited. In addition, because there is no need for additional complicated production steps, the present invention can be realized at low cost.

BRIEF DESCRIPTION OF THE DRAWINGS

FIGS. 1A and 1B show a schematic structure and a characteristic of a packaging board, respectively, according to an exemplary embodiment 1 of the present invention, and FIG. 1A is a cross section and FIG. 1B is a graph of the elasticity of the wiring board along A-A'.

FIG. 2 shows a first curved shape of a board base of the packaging board according to an exemplary embodiment 1 of the present invention, and (A) is a plan view, (B) is a cross section along X-X' and (C) is a cross section along, Y-Y'.

FIG. 4 shows a schematic cross sectional view for illustrating the production method of the packaging board according to an exemplary embodiment 1 of the present invention.

FIGS. 5A and 5B show a schematic structure and a characteristic respectively, of a packaging board according to an exemplary embodiment 2 of the present invention, and FIG. 5A is a cross section and FIG. 5B is a characteristic graph of the elasticity of the wiring board along A-A'.

FIGS. 7A and 7B show a schematic structure and a characteristic respectively, of a packaging board according to an exemplary embodiment 3 of the present invention, and FIG. 7A is a cross section and FIG. 7B is a characteristic graph of the elasticity of the wiring board along A-A'.

FIG. 8 shows a schematic plan view of the reinforced area, stress relaxation area and bending area of the packaging board according to the exemplary embodiment 3 of the present invention.

FIGS. 9A and 9B show a schematic structure and a characteristic respectively, of the packaging board according to an exemplary embodiment 4 of the present invention, and FIG. 9A is a cross section and FIG. 9B is a characteristic graph of the elasticity of the wiring board along A-A'.

FIG. 10 shows a schematic cross sectional view for illustrating a production method of the packaging board according to an exemplary embodiment 4 of the present invention.

FIGS. 11A and 11B show a schematic structure of an electronic device with the packaging board and a characteristic, respectively, of the packaging board according to an exemplary embodiment 5 of the present invention, and FIG. 11A is a partial cross section and FIG. 11B is a characteristic graph of the elasticity of the wiring board along B-B'.

FIG. 12 shows a schematic cross sectional structure of a semiconductor device having the wiring board according to conventional art 1.

FIG. 13 shows a schematic cross sectional structure of a semiconductor device having the wiring board according to conventional art 2 (comparative)

FIG. 14 shows a schematic cross sectional structure of the wiring board according to conventional art 3.

FIG. 15 shows a schematic cross sectional structure of the wiring board according to conventional art 4.

FIG. 16 shows a schematic cross sectional structure of the wiring board according to conventional art 5.

Figure 3:
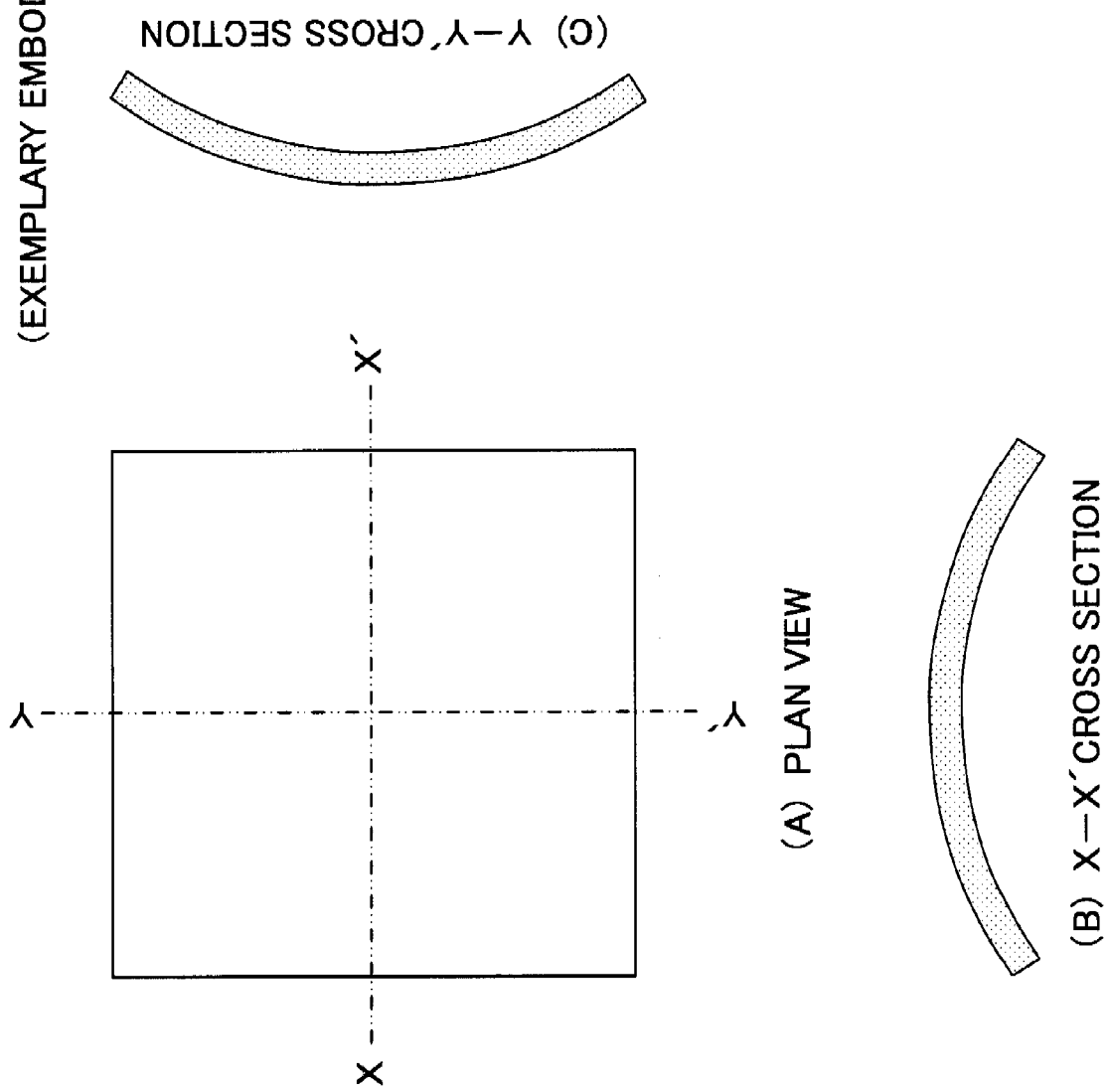
FIG. 3 shows a second curved shape of a board base of the packaging board according to an exemplary embodiment 1 of the present invention, and (A) is a plan view, (B) is a cross section along X-X' and (C) is a cross section along Y-Y'.

EXPLANATIONS OF SYMBOLS 1 packaging (mounted) board
10 curved board (wiring board)
10a reinforced area
10b stress relaxation area
10c bending area
10d quasi-reinforced area
11 insulation layer
12 wiring layer
13, 13A, 13B, 13C insulation layer
14 via
14a bump
15 wiring layer
15a pad portion
16 wiring layer
16a pad portion
20 electronic component
30 solder ball
40 mask
50 support member
60 casing
110 semiconductor device
112 board
114 semiconductor chip
116 bump
118 structure
120 adhesive
122 under filling
124 ball bump
126 concavity portion
128 void
201 electronic component
202 solder ball
203 wiring board
204 pad
205 wiring
206 via
301 wiring board
301a core board
301b buildup layer
302, 303 inner conducting layer
304, 305 interlayer insulation film
306 surface conducting layer
307 solder resist
309 terminal electrode (pad)
310 electronic component
311 conductive adhesive material
312 insulating deformation protecting portion (via)
401 multilayered wiring board
402 reinforcing layer
403 adhesive layer
404 bending portion
501 flexible wiring circuit board
502 base insulation layer
503 conductive layer
504 cover insulation layer
505 electronic component
506 terminal
507 reinforcing plate
508 reinforced portion
509 bending portion
511 mount supporting portion
512 stress relaxation portion
513 opening
514 bump

PREFERRED MODES OF THE INVENTION

Exemplary Embodiment 1

A packaging board according to an exemplary embodiment 1 of the present invention is explained with reference to the figures. FIGS. 1A and 1B show a schematic structure and a characteristic respectively, of the packaging board according to an exemplary embodiment 1 of the present invention, and FIG. 1A is a cross section and FIG. 1B is a graph of the elasticity of the wiring board along A-A'. FIG. 2 shows a first curved shape of a board base of the packaging board according to an exemplary embodiment 1 of the present invention, and (A) is a plan view, (B) is a cross section along X-X' and (C) is a cross section along Y-Y'. FIG. 3 shows a second curved shape of a board base of the packaging board according to an exemplary embodiment 1 of the present invention, and (A) is a plan view, (B) is a cross section along X-X' and (C) is a cross section along Y-Y'.

Referring to FIG. 1A, a packaging board 1 has a structure on which an electronic component 20 is mounted on a curved board 10.

The curved board 10 is a wiring board having at least partial curved surface area on its surface. The curved board 10 is basically classified into two kinds of curve patterns and one has only one directional bending shown as FIG. 2 (bending in X-X' direction only in this case) and the other has two directional bending shown as FIG. 3 (bending in X-X' and Y-Y' directions in this case). And each of the curve patterns can include a free-curvature curve composed by free lines as well as a constant curvature curve and the curved board is constituted by the curve pattern(s) at least partially.

The curved board 10 comprises an insulation layer 11, wiring layer 12, insulation layer 13, via 14, wiring layer 15 and wiring layer 16. The wiring board, at least a part thereof being composed by the curved surface, is called "curved board" and the wired board is called "wiring board" regardless of the presence of the curved surface.

The curved board 10 comprises a reinforced area 10a, stress relaxation area 10b and bending area 10c. The reinforced area 10a is an area on which the electronic component 20 is mounted and has a higher elastic modulus than the other areas 10b or 10c to reinforce against outer stress. A plurality of pad portions 15a are provided on the reinforced area 10a. The bending area 10c is an area where the electronic component 20 is not provided and is bent easily by the outer stress than the reinforced area 10a due to its low elastic modulus compared to that of the other area 10a or 10b. The stress relaxation area 10b is provided in the area between the reinforced area 10a and the bending area 10c. The stress relaxation area 10b has an intermediate elastic modulus between those of the reinforced area 10a and the bending area 10c, and plays a role to relax the stress carried from the bending area 10c to the reinforced area 10a. The elastic modulus of the stress relaxation area 10b changes continuously from a high value correspondent with a side near to the reinforced area 10a to a low value correspondent with a side near to the bending area 10c. Owing to the existence of the stress relaxation area 10b, a disconnection (connection defect) in the wiring layer 15 or the wiring layer 12 does not occur even when the wiring layer 15 or the wiring layer 12 is provided across the reinforced area 10a to the bending area 10c. The elastic modulus of each area 10a to 10c can be varied by changing a degree of crystallization or a degree of polymerization mainly of the insulation layer 13.

The insulation layer 11 is made of an insulation material having a curved surface. The base material for the insulation layer can be a polyimide resin base used for a general wiring board. However, the material should not be limited as the polyimide resin and other materials such as a glass epoxy resin (glass cloth impregnated with an epoxy resin) or an epoxy resin using an aramid nonwoven fabric instead of the glass cloth can be used. The insulation layer 11 can be made of a material having a good workability into a curved surface such as, for example, a thermoplastic resin which becomes soft and deform easily and keeps the deformed shape, such as a liquid crystal polymer, for example.

The wiring layer 12 is a conductive layer formed between the insulation layer 11 and the insulation layer 13. A low resistance material having a low electric resistance such as Cu as well as general wiring materials can be used for the material of the wiring layer 12.

The insulation layer 13 is a insulation layer formed on the insulation layer 11 and the wiring layer 12. The insulation layer 13 has a via hole communicated to the wiring layer 12 at a determined position. When a fear about a solder short is concerned due to narrow pitch of terminals of the electronic component 20 mounted on the surface (exposed surface) of the insulation layer 13, a solder resist layer can be formed on the surface. A photosensitive insulation material which generates internal structural change (phase transition) by an irradiation of any excitation light is used for the insulation layer 13. One example of such a photosensitive material is a quenched film made of fused-mixed crystalline material and non-crystalline material. This type of photosensitive insulation material can be crystallized by irradiation of selective excitation light or can be solidified in the non-crystalline state by quenching. A material including fine particles as cores of the crystallization or having a higher crystallization temperature than the reflow temperature is desirable to increase the crystallization controllability of the insulation layer 13. An organic material having a low polymerization degree is also possible for the photosensitive insulation material. The polymerization of such a material is accelerated in an area where the excitation light is irradiated and a high elastic modulus insulation layer having a network structure of higher density is formed. On the other hand, the farther from the area where the excitation light is irradiated, the smaller becomes the polymerization degree in an area where the excitation light is not irradiated and the density of the network structure becomes smaller and the elastic modulus is decreased. A combination material of the photosensitive insulation material made of fused-mixed crystalline material and non-crystalline material and the photosensitive insulation material using an organic material having a low degree of polymerization can be also used for the insulation layer 13.

The via 14 is a conductive portion electrically connecting the wiring layer 12 and the wiring layer 15. A low resistance material such as solder or copper can be used for the via 14.

The wiring layer 15 is a conductive layer formed on the insulation layer 13. The wiring layer 15 has a plurality of pad portions 15a on the reinforced area 10a. The pad portion 15a is connected electrically and mechanically to a corresponding external terminal (not shown) of the electronic component 20 via a solder ball 30. Because the pad portion 15a is positioned within the area surrounded by the outer circumferential boundary line of the reinforced area 10a, the pad portion 15a is hardly affected by the curvature deformation at the bending area 10c. A low resistance material such as copper can be used for the wiring layer 15. By taking a stress to the wiring layer 15 during a deformation process to follow the curve or concavo-convex profile of the insulation layer into account, a wiring material such as an electrolytic copper produced by electrolytic coating method having a high crack resistance is desirable. Also the wiring layer 15 can be made of a foil of a resin coated copper foil (RCC) united with the insulation layer 13, which remained on a resin after plasma or laser ablation of an unnecessary copper foil. The wiring layer 15 can be constructed integral with the via 14 or separately from the via 14.

The wiring layer 16 is a conductive layer formed on the opposite side of the wiring layer 12 of the insulation layer 11. A low resistance material having a low electric resistance such as Cu as well as general wiring materials can be used for the material of the wiring layer 16.

The electronic component 20 is connected to the pad portion 15a electrically and mechanically on an external terminal (not shown) arranged in a grid pattern via the solid balls 30. Although a general semiconductor package as an example is used as the electronic component 20 in FIG. 1A, the component is not limited to the semiconductor package packaged by mold enclosure, but any semiconductor component usually mounted on a general planar board such as a non-packaged semiconductor chip, a QFP (Quad Flat Package) having gull-wing leads as external terminals, a connector component and an ACF (Anisotropic Conductive Film) can be applicable.

According to the structure described above, even when a general electronic component 20 having the solder balls 30 in a grid pattern is mounted, the stress generation at the solder connecting portion of the electronic component 20 can be suppressed and in addition, the concentration of the stress in the neighborhood of the mounted portion of the electronic component 20 on the curved board 10 can be suppressed. As a result, the same reliability of the solder connection as that of the connection to a planar board can be obtained.

Next, a production method of the packaging board according to an exemplary embodiment 1 of the present invention is explained with reference to the figures. FIG. 4 shows a schematic cross sectional view for illustrating the production method of the packaging board according to an exemplary embodiment 1 of the present invention.

At first a wiring layer 12 and a wiring layer 16 are formed on an insulation layer 11 (step A1; see (a) of FIG. 4). And a wiring layer 15 is formed on an insulation layer 13. There are two patterning method of the wiring layers 12 and 16, one of which is (A): a subtractive method to form the wiring pattern by etching excessive parts of a copper foil or a copper coating formed on the insulation layer 11 and the other is (B): an additive method or a semi-additive method to form the wiring by coating after masking of a portion except the wiring layers 12 and 16 with an insulation material. The pattern of the wiring layer 15 can be also formed by the same methods. The polyimide resin base can be used for the insulation layer 11 and a photosensitive insulation material can be used for the insulation layer 13.

Next, a bump 14a, which is formed into the via (via 14 in (c) of FIG. 4) at the next step, is formed at a predetermined position(s) on the wiring layer 12 of the insulation layer 11 (step A2; see (b) of FIG. 4). The bump 14a is formed like a pin shape having an enough height to reach the wiring layer 15 penetrating through the insulation layer 13 when the insulation layer 13 is laminated on the insulation layer 11. The method to form the bump 14a like a pin shape is that, for example, a molten connecting material (a solder, for example) is adhered on the wiring layer 15 and a pin shape item is contacted on the surface of the connecting material and then draw up the item.

Next, after adjustment of the position of the insulation layer 11 and the insulation layer 13 and lamination of them, the wiring layer 15 on the insulation layer 13 and the wiring layer 12 on the insulation layer 11 are electrically connected via the via 14 by pressing the bump 14a, which is formed into the via 14 (step A3; see (c) FIG. 4). At the pressing step, a reflow process is executed at a determined temperature (200° C., for example) to melt the bump (denoted 14a in (b) of FIG. 4). Then the production of the wiring board 10 is completed.

Next, the reinforced area 10a, stress relaxation area 10b and bending area 10c are formed on the wiring board 10 (step A4; see (d) of FIG. 4). The phase transition of a determined area of the insulation layer 13 of the wiring board 10 is introduced at this step. For example, an excitation light introducing the phase transition is irradiated only on the determined area using a mask 40 maintaining the temperature of the wiring board 10 lower than the phase transition temperature of the insulation layer 13. By the irradiation of the excitation light, the phase transition of the insulation layer 13 is accelerated since an activation energy which is necessary for the phase transition is supplied. When an isotropic light is used for the excitation light, the farther from an edge of an opening of the mask, the weaker the intensity of the excitation light becomes. Because the crystallization is accelerated according to the intensity of the excitation light (activation energy), the degree of crystallization of the insulation layer 13 becomes large at the opening portion of the mask and becomes smaller as the position departs from the edge of the opening of the mask.

The elastic modulus of a resin containing a crystalline phase has a tendency to change depending to the size and density of the crystalline phase compared to an amorphous resin. Therefore, the reinforced area 10a having a high elastic modulus is formed at an area having a high degree of crystallization, which corresponds to the mask opening portion, and the stress relaxation area 10b is formed at an area having a diminishing elastic modulus corresponding a diminishing degree of crystallization as a distance from the edge of the opening of the mask becomes large. The bending area 10c is formed at an area having a constant degree of crystallization at a position remote from the edge of the opening of the mask. As a result, a structure having an area of diminishing elastic modulus along the in-plane direction (of the surface) of the insulation layer around the reinforced area 10a having a high elastic modulus can be obtained. A similar structure having the reinforced area 10a, stress relaxation area 10b and bending area 10c, all of which have the similar elastic features as described above, can be formed by irradiation of the excitation light on a photosensitive insulation material as the insulation layer 13 made of an organic material with a low degree of polymerization. And also a similar structure having the reinforced area 10a, stress relaxation area 10b and bending area 10c, all of which have the similar elastic features as described above, can be formed by irradiation of the excitation light on the insulation layer 13 made of a combination material of a photosensitive insulation material made of fused-mixed crystalline material and non-crystalline material and a photosensitive insulation material made of an organic material having a low degree of polymerization.

The bending area 10c can also be formed by an application of a resin of low elastic modulus after forming a resin having a high elastic modulus on the reinforced area 10a partially at step A4. The stress relaxation area 10b can be formed before forming the bending area 10c or after forming the bending area 10c. The stress relaxation area 10b can also be formed by a mutual diffusion of the reinforced area 10a and the bending area 10c after forming the reinforced area 10a and the bending area 10c.

Next, an electronic component 20 is mounted on the wiring board 10 (step A5; see (e) of FIG. 4). For example, a solder cream (not shown) is printed on the pad portion 15a of the wiring board 10 and the electronic component 20 is mounted. After that the solder cream (not shown) is molten by a reflow and then the electronic component 20 and the wiring board 10 is connected electrically and mechanically via the solder balls 30.

Finally the wiring board 10 is curved (step A6; see (f) of FIG. 4). Because the electronic component 20 is connected to the pad portion 15a on the wiring board 10 rigidly via the solder ball 30, the wiring board 10 can be bended into curved plate having any curvature by applying bending force to the wiring board 10 under heated and pressed condition.

Thus the packaging board including a part of the wiring board 10 corresponding to the reinforced area 10a just beneath the electronic component 20 having a high elastic modulus, a part of the wiring board 10 corresponding to the bending area 10c except the mounting area of the electronic component 20 having a low elastic modulus and a part of the wiring board 10 corresponding to the stress relaxation area 10b between the both areas where the elastic modulus changes continuously can be obtained. The stress concentration at the solder ball(s) 30 and the wiring layer 15 on the curved board 10 can be suppressed by the structure.

According to an exemplary embodiment 1, the structure of the wiring board is three-layered for easy understanding; however, more multi-layered wiring board can be used. Although the wiring board 10 is fabricated by laminating insulation layers forming the wiring layers in the production steps A1 to A3, the production method is not limited to this method, and a following method may be used. That is, the insulation layer 13 is formed on the insulation layer 11 having the wiring layers 12 and 16 formed thereon, a base hole for the via 14 is formed on the insulation layer 13, the via 14 is formed in the base hole, and the wiring layer 15 is formed on the insulation layer 13.

Exemplary Embodiment 2

Figure 6:
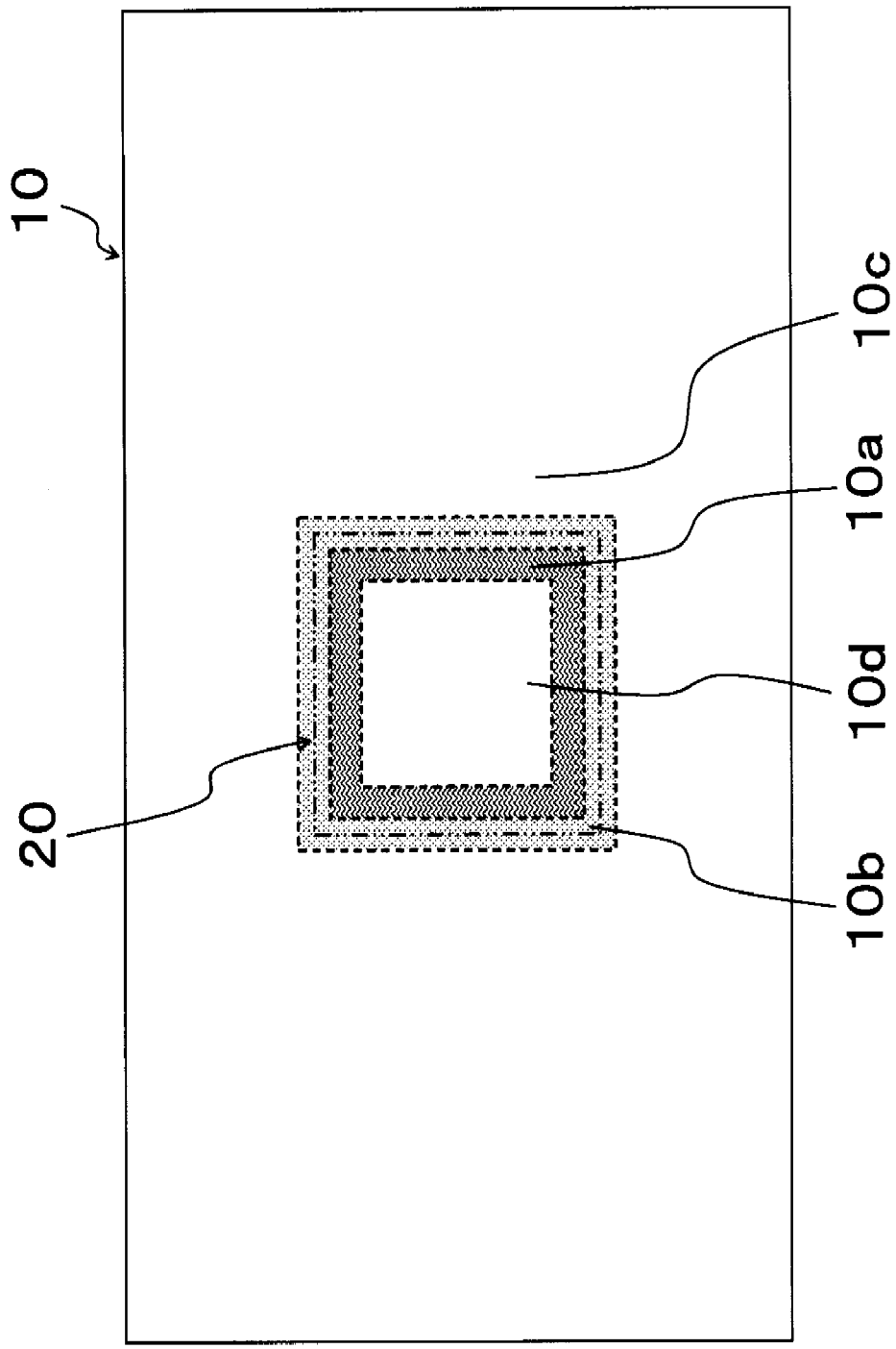
FIG. 6 shows a schematic top plan view of the reinforced area, stress relaxation area and bending area of the packaging board according to the exemplary embodiment 2 of the present invention.

Next, a packaging board according to an exemplary embodiment 2 of the present invention is explained with reference to the figures. FIGS. 5A and 5B show a schematic structure and a characteristic, respectively, of the packaging board according to an exemplary embodiment 2 of the present invention, and FIG. 5A is a cross section and FIG. 5B is a characteristic graph of the elasticity of the wiring board along A-A'. FIG. 6 shows a schematic plan view of the reinforced area, stress relaxation area and bending area of the packaging board according to an exemplary embodiment 2 of the present invention.

The structure of an exemplary embodiment 2 is basically the same of that of an exemplary embodiment 1 except changing an area where the reinforced area 10a is formed. Referring to FIG. 5A, as for a packaging board 1 according to an exemplary embodiment 2, the reinforced area 10a of high elastic modulus is limited in an area only just under the circumferential part of the electronic component 20 (including the most outer pad portion 15a) of the area beneath the electronic component 20. The bending area 10c of low elastic modulus is provided outside the circumferential area of the reinforced area 10a and the stress relaxation area 10b having a changing elastic modulus is provided between the reinforced area 10a and the bending area 10c. In the cross section of FIG. 5A, the reinforced area 10a seems to be separated; however, the area is a connected area like a circle when viewed from the upper side of the electronic component 20 (see FIG. 6). Although there is a stress relaxation area of changing elastic modulus and a bending area of low elastic modulus in appearance (see FIG. 5B) inside the inner radius of the reinforced area 10a like outside the circumferential area, those areas becomes practically reinforced area (quasi-reinforced area 10d) because they are surrounded by the reinforced area 10a.

According to an exemplary embodiment 2, by forming the reinforced area 10a of high elastic modulus just under the circumferential part of the electronic component 20 (under the most outer pad portion 15a), an affect of the deformed board is suppressed as an exemplary embodiment 1.

In addition, according to the structure of an exemplary embodiment 2, the reinforced area 10a can be limited within a narrow area. Therefore, the reinforced area 10a, the stress relaxation area 10b and the bending area 10c can be formed directly without using a mask during the step to form these areas (phase transition step; corresponding to step A4 of an exemplary embodiment 1) by using a directional electron beam, for example, as the excitation light. When using the electron beam, the insulation layer 13 just under the pad portion 15a, which positioned at the most outer circumferential part of the electronic component 20 on the wiring board 10 even if the electronic component 20 is already mounted on the board 10, can be excited by inclination of the output direction of the electron beam against the surface of the wiring board. Therefore, a design modification at a preproduction step of the wiring board 10 can be easily tried and a term necessary for the design can be reduced.

Exemplary Embodiment 3

A packaging board according to an exemplary embodiment 3 of the present invention is explained with reference to the figures. FIGS. 7A and 7B show a schematic structure and a characteristic, respectively, of the packaging board according to an exemplary embodiment 3 of the present invention, and FIG. 7A is a cross section and FIG. 7B is a characteristic graph of the elasticity of the wiring board along A-A'. FIG. 8 shows a schematic top plan view of the reinforced area, stress relaxation area and bending area of the packaging board according to an exemplary embodiment 3 of the present invention.

An exemplary embodiment 3 is basically similar to an exemplary embodiment 2; however, an area to form the reinforced area 10a is changed and electronic components 20 are mounted on both upper and lower sides of the wiring board 10. Referring to FIGS. 7 and 8, according to the packaging board 1 of an exemplary embodiment 3, the area to form the reinforced area 10a of high elastic modulus is changed corresponding to the mounting position of the electronic components 20 on both upper and lower sides and the pad portions 15a and 16a are provided within an area surrounded by the outer circumferential boundary line of the reinforced area 10a. An exemplary embodiment 3 has a similar effect as that of exemplary embodiments 1 and 2.

Exemplary Embodiment 4

FIGS. 9A and 9B show a schematic structure and a characteristic, respectively, of the packaging board according to an exemplary embodiment 4 of the present invention, and FIG. 9A is a cross section and FIG. 9B is a characteristic graph of the elasticity of the wiring board along A-A'.

An exemplary embodiment 4 is basically similar to an exemplary embodiment 3; however, insulation layers 13A to 13C (insulation layers made of photosensitive materials) whose elastic modulus changes in each area 10a to 10c of the wiring board 10 are provided not only as surface layers but also as an inner layer (intermediate layer). A structure whose surface layers are formed as an insulation layer 11 made of a polyimide resin-based material, etc., and an insulation layer 13 is provided only as the inner layer (intermediate layer).

Next, a production method of the packaging board according to an exemplary embodiment 4 of the present invention is explained with reference of the figures. FIG. 10 shows a schematic cross sectional view for illustrating the production method of the packaging board according to an exemplary embodiment 4 of the present invention.

At first, a wiring layer 15 is formed on an insulation layer 13A, a wiring layer 12 is formed on an insulation layer 13B and a wiring layer 15 is formed on an insulation layer 13C. After that, the reinforced area 10a, stress relaxation area 10b and bending area 10c are formed on the insulation layer 13B (and also on the insulation layer 13A and 13C) (step B1; see (a) of FIG. 10). Because it is very difficult to change an elasticity of the inner insulation layer 13B, the areas 10a to 10c are formed before laminating the insulation layers 13A to 13C. The layers 10a to 10c can be formed by keeping the temperature of the insulation layers 13A to 13C not more than the phase transition temperature and irradiation of the excitation light for phase transition on the necessary area using a mask 40, as explained at step A4 of an exemplary embodiment 1.

Next, a bump 14a, which will be formed as a via (denoted 14 in (c) of FIG. 10) at the next step, is formed on the determined position of the wiring layer 12 on the insulation layer 13B (step B2; see (b) of FIG. 10). Next, the insulation layers 13A to 13C are laminated after positioning of the layers and the bump 14a is pressed into the via 14. Then the wiring layer 15 on the insulation layer 13A and the wiring layer 12 on the insulation layer 13B are connected electrically via the via 14 and the wiring layer 15 on the insulation layer 13C and the wiring layer 12 on the insulation layer 13B are connected electrically via the via 14 (step B3; see (c) of FIG. 10). Next, the electronic components 20 are mounted on the wiring board 10 (step B4; see (d) of FIG. 10). Finally, the wiring board 11D is bent (step B5; see (e) of FIG. 10).

An exemplary embodiment 3 has a similar effect as that of an exemplary embodiment 1.

Exemplary Embodiment 5

Next, a packaging board according to an exemplary embodiment 5 of the present invention is explained with reference to the figures. FIGS. 11A and 11B show a schematic structure of an electronic device with the packaging board and a characteristic respectively, of the packaging board according to an exemplary embodiment 5 of the present invention, and FIG. 11A is a partial cross section and FIG. 11B is a characteristic graph of the elasticity of the wiring board along B-B'.

An exemplary embodiment 5 is basically similar to an exemplary embodiment 2; however, areas to form the reinforced area 10a are provided not only near the mounting area of the electronic component 20 but also near a support member 50 supporting the wiring board 10. It is not necessary for the reinforced area 10a to be provided over all of the area near the support member 50, but the reinforced area 10a can be provided only a part of the area near the support member 50 in case when the wiring area 15 is provided on a surface near the support member 50 (see the wiring layer 15 near the support member 50 on the left side of FIG. 11A) or when the flexible wiring board 10 is supported on a casing (package) 60, for example. The support member 50 is adhered inside the casing 60 and grips the edge of the wiring board 10.

According to an exemplary embodiment 5, disconnection (connection defect) not only of the wiring layer 15 on the surface near the mounting area of the electronic component 20 but also of the wiring layer 15 on the surface near the support member 50 of the wiring board 10 can be suppressed.

When the flexible wiring board 10 is supported on the casing 60, the wiring board 10 may bend extremely because the wiring board 10 is gripped by the support member 50 and the stress is concentrated at the edge of the gripped area of the wiring board 10. In such a case, the stress concentration can be relaxed by providing the reinforced area 10a for the gripped area of the wiring board 10 and providing the relaxation area 10b for the adjacent portion to the reinforced area 10a.

The added value of the products can be increased by application of the present invention to the structure of the electronic device whose design is important because the mounting structure of the wiring board having the curved shape fitted to the curved casing by which the components can be disposed efficiently in the casing of curved exterior as described above. Especially, the present invention can be preferably applied to portable apparatus which needs down sizing or low profiling such as mobile phone, digital still camera, PDA (Personal Digital Assistant) or note-type personal computer, for example.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modification aforementioned.

The invention claimed is:

1. A flexible wiring board wherein a plurality of insulation layers and wiring layers are piled up alternately and the wiring layers are via-connected each other, comprising:
a reinforced area being reinforced against an external stress;
a bending area bending easier than the reinforced area by the external stress; and
a stress relaxation area that is provided in an area between the reinforced area and the bending area, bends easier than the reinforced area by the external stress and not easier than the bending area by the external stress, and relaxes the stress carried from the bending area to the reinforced area,
wherein a degree of crystallization of at least one insulation layer of the stress relaxation area is smaller than a degree of crystallization of at least one insulation layer of the reinforced area and is larger than a degree of crystallization of at least one insulation layer of the bending area, and
wherein the degree of crystallization of the stress relaxation area changes continuously from a high value correspondent with a side near to the reinforced area to a low value correspondent with a side near to the bending area.

2. The wiring board as defined in claim 1, wherein an elastic modulus of the stress relaxation area is smaller than an elastic modulus of the reinforced area and is larger than an elastic modulus of the bending area, and
wherein the elastic modulus of the stress relaxation area changes continuously from a high value correspondent with a side near to the reinforced area to a low value correspondent with a side near to the bending area.

3. The wiring board as defined in claim 1 comprising a quasi-reinforced area being provided radially internal of the reinforced area and surrounded with the reinforced area, and bending easier than the reinforced area, wherein the bending area and the stress relaxation area are provided at an outer circumference of the reinforced area.

4. The wiring board as defined in claim 1, wherein at least one of the insulation layers is made of a photosensitive insulation material.

5. The wiring board as defined in claim 1, wherein a plurality of pad portions are arranged inside an outer circumferential boundary line of the reinforced area on one side or both sides of the wiring board.

6. A packaging board comprising:
the wiring board as defined in claim 5, and
an electronic component electrically and mechanically connected to the pad portions via a conductive material.

7. The packaging board as defined in claim 6, wherein a curvature of the reinforced area is smaller than a curvature of the bending area when a part or all of the wiring board is bended.

8. An electronic device comprising:
a casing having a curved exterior,
the packaging board as defined in claim 6, and
a support member being provided in the casing and supporting the packaging board.

9. The electronic device as defined in claim 8, wherein the packaging board is provided with the reinforced area at a part or all of a portion supported by the support member and the stress relaxation area is provided in an area adjacent to the reinforced area.

10. A flexible wiring board wherein a plurality of insulation layers and wiring layers are piled up alternately and the wiring layers are via-connected each other, comprising:
a reinforced area being reinforced against an external stress;
a bending area bending easier than the reinforced area by the external stress; and
a stress relaxation area that is provided in an area between the reinforced area and the bending area, bends easier than the reinforced area by the external stress and not easier than the bending area by the external stress, and relaxes the stress carried from the bending area to the reinforced area,
wherein a degree of polymerization of at least one insulation layer of the stress relaxation area is smaller than a degree of polymerization of at least one insulation layer of the reinforced area and is larger than a degree of polymerization of at least one insulation layer of the bending area, and
wherein the degree of polymerization of the stress relaxation area changes continuously from a high value correspondent with a side near to the reinforced area to a low value correspondent with a side near to the bending area.

* * * * *